(12) United States Patent
Zhou et al.

(10) Patent No.: US 10,403,757 B2
(45) Date of Patent: Sep. 3, 2019

(54) TOP-GATE SELF-ALIGNED METAL OXIDE SEMICONDUCTOR TFT AND METHOD OF MAKING THE SAME

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Xingyu Zhou, Guangdong (CN); Jangsoon Im, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 35 days.

(21) Appl. No.: 15/736,132

(22) PCT Filed: Nov. 20, 2017

(86) PCT No.: PCT/CN2017/111969
§ 371 (c)(1),
(2) Date: Dec. 13, 2017

(87) PCT Pub. No.: WO2019/071725
PCT Pub. Date: Apr. 18, 2019

(65) Prior Publication Data
US 2019/0172954 A1    Jun. 6, 2019

(30) Foreign Application Priority Data

Oct. 9, 2017   (CN) .......................... 2017 1 0931774

(51) Int. Cl.
*H01L 27/32*      (2006.01)
*H01L 29/786*     (2006.01)
(Continued)

(52) U.S. Cl.
CPC .... *H01L 29/78633* (2013.01); *H01L 21/0273* (2013.01); *H01L 21/44* (2013.01);
(Continued)

(58) Field of Classification Search
CPC ...................................................... H01L 21/702
See application file for complete search history.

(56) References Cited

U.S. PATENT DOCUMENTS

| | | |
|---|---|---|
| 2013/0256652 A1 | 10/2013 | Lee et al. |
| 2013/0300968 A1 | 11/2013 | Okajima et al. |

(Continued)

FOREIGN PATENT DOCUMENTS

| | | |
|---|---|---|
| CN | 103681690 A | 3/2014 |
| CN | 104752436 A | 7/2015 |

(Continued)

*Primary Examiner* — Cheung Lee
(74) *Attorney, Agent, or Firm* — Hauptman Ham, LLP

(57) ABSTRACT

The present disclosure provides a top-gate self-aligned metal oxide semiconductor TFT and a manufacturing method thereof. By providing a light-shielding layer below an active layer to protect the active layer from light irradiation and prevent the TFT from generating a negative threshold voltage drift phenomenon. Further, by connecting the light-shielding layer to the source, a stable voltage is generated on the light-shielding layer to avoid the floating gate effect, so as to improve the working stability of the TFT effectively. The top-gate self-aligned metal oxide semiconductor TFT produced by the method of the present disclosure does not generate negative threshold voltage drift phenomenon and floating gate effect, resulting in good working stability.

7 Claims, 8 Drawing Sheets

(51) Int. Cl.
    *H01L 29/66*         (2006.01)
    *H01L 29/40*         (2006.01)
    *H01L 29/423*       (2006.01)
    *H01L 21/4763*      (2006.01)
    *H01L 29/24*         (2006.01)
    *H01L 21/44*         (2006.01)
    *H01L 21/027*       (2006.01)
    *H01L 21/8234*      (2006.01)
    *H01L 51/52*         (2006.01)

(52) U.S. Cl.
    CPC .......... *H01L 21/47635* (2013.01); *H01L 21/823475* (2013.01); *H01L 27/3244* (2013.01); *H01L 27/3272* (2013.01); *H01L 27/3274* (2013.01); *H01L 29/24* (2013.01); *H01L 29/401* (2013.01); *H01L 29/42384* (2013.01); *H01L 29/66969* (2013.01); *H01L 29/7869* (2013.01); *H01L 29/78696* (2013.01); *H01L 51/5281* (2013.01)

(56) References Cited

U.S. PATENT DOCUMENTS

| | | | |
|---|---|---|---|
| 2017/0062542 A1* | 3/2017 | Jung | H01L 27/3272 |
| 2018/0123078 A1* | 5/2018 | Byun | H01L 51/5206 |

FOREIGN PATENT DOCUMENTS

| | | |
|---|---|---|
| CN | 106486526 A | 3/2017 |
| CN | 107507867 A | 12/2017 |

\* cited by examiner

TOP-GATE SELF-ALIGNED METAL OXIDE SEMICONDUCTOR TFT AND METHOD OF MAKING THE SAME

RELATED APPLICATIONS

The present application is a National Phase of International Application Number PCT/CN2017/111969, filed on Nov. 20, 2017, and claims the priority of China Application No. 201710931774.X, filed on Oct. 9, 2017.

FIELD OF THE DISCLOSURE

The present disclosure relates to a display panel technology, and more particularly to a top-gate metal oxide semiconductor TFT and a method of making the same.

BACKGROUND

Flat display device is widely used due to thin body, power saving, no radiation and many other advantages. The existing flat display device includes mainly a liquid crystal display (LCD) and an organic light emitting display (OLED).

LCD display device is widely used in various consumer electronics such as mobile phones, televisions, personal digital assistants, digital cameras, notebook computers, and desktop computers for their high image quality, power saving, thin body and wide application advantages, thus becoming the mainstream in the display device.

OLED display device is an active light-emitting display with advantages of self-luminous, high contrast, wide viewing angle up to 170°, fast response, high luminous efficiency, low operating voltage (3V to 0V), and ultrathin thickness (less than 2 mm). Therefore, it has more excellent color display quality, wider viewing range and greater design flexibility.

Thin film transistor (TFT) is an important part of flat display device and can be formed on glass substrate or plastic substrate, it is commonly used as switching device and driving device in, for example, LCD display device and OLED display device.

Metal oxide semiconductor TFT is popular in current technology, metal oxide semiconductor due to its high electron mobility (oxide semiconductor mobility>10 $cm^2Ns$, a-Si mobility of only 0.5~0.8 $cm^2Ns$), simple manufacturing process and high process compatibility with the a-Si TFT compared with low temperature polysilicon (LTPS), can therefore be applied to LCD display device and OLED display device. It is suitable for small to large size displays, has a good prospect of application development, and serves a popular research in the current industry.

Since the metal oxide semiconductor is relatively sensitive to light, the threshold voltage of the metal oxide semiconductor TFT is obviously negatively shifted after light irradiation. An improved method in the prior art is to disposed a metal light-shielding layer below an active layer of the metal oxide semiconductor to eliminate the TFT negative voltage drift caused by light. However, the metal light-shielding layer may cause some negative effects such as a floating gate effect. The floating gate effect means that the metal light-shielding layer disposed corresponding to the bottom of the active layer, therefore, is equivalent to a bottom gate. Although the metal light-shielding layer is not electrically connected to other charged layers in the TFT structure, it is easily affected by the voltage on these charged layers. Therefore, the metal light-shielding layer carries various voltages. Since the metal light-shielding layer has a fluctuating voltage, the threshold voltage of the TFT will constantly change during operation, resulting in unstable operation of the TFT.

SUMMARY

One objective of the present disclosure is to provide a method of manufacturing a top-gate self-aligned metal oxide semiconductor TFT, the method can prevent the TFT from generating negative threshold voltage drift phenomenon and floating gate effect, and improve the working stability of the TFT.

The other objective of the present disclosure is to provide a top-gate self-aligned metal oxide semiconductor TFT without generating negative threshold voltage drift phenomenon and floating gate effect, the TFT has better working stability.

In order to achieve the above objectives, the present disclosure provides a method of manufacturing a top-gate self-aligned metal oxide semiconductor TFT, comprising: providing a light-shielding layer below an active layer, and connecting the light-shielding layer to a source.

The method of manufacturing a top-gate self-aligned metal oxide semiconductor TFT according to claim 1 further comprises:

Providing a base substrate, forming the light-shielding layer on the base substrate, forming a buffer layer on the base substrate covering the light-shielding layer, forming the active layer on the buffer layer corresponding to a region above the light-shielding layer, material of the active layer is a metal oxide semiconductor material;

Forming a gate insulating layer on the buffer layer covering the active layer, and depositing a gate metal layer on the gate insulating layer;

Forming a photoresist layer on the gate metal layer and patterning the photoresist layer by a photo lithography process, wherein the remaining photoresist layer defines a gate pattern on the gate metal layer;

Using the photoresist layer as a barrier and etching the gate metal layer to obtain a gate corresponding to a region above the active layer;

Using the photoresist layer and the gate as the barrier, etching the gate insulating layer by keeping only a portion corresponding to a region below the gate and removing other portions, wherein the keeping gate insulating layer is located on the active layer and aligned with the gate from top to bottom, the gate and the gate insulating layer define a channel region corresponding to a region below the gate insulating layer, as well as a source contact region and a drain contact region located on two sides of the channel region, respectively;

Using the photoresist layer, the gate and the gate insulating layer as the barrier, conducting a conductive treatment on the active layer, turning the metal oxide semiconductor material of the source contact region and the drain contact region into a conductor, keeping semiconductor characteristics for the metal oxide semiconductor material of the channel region; and peeling off the photoresist layer after the conductive treatment is completed;

Forming an interlayer insulating layer on the buffer layer covering the gate and the active layer; forming a source contact hole and a drain contact hole on the interlayer insulating layer corresponding respectively to the source contact region and the drain contact region, and simultaneously forming a signal via hole on the interlayer insulating layer and the buffer layer corresponding to a region above the light shielding layer;

Forming the source and a drain on the interlayer insulating layer, wherein the source and the drain are respectively electrically connected to the source contact region and the drain contact region through the source contact hole and the drain contact hole, while the source is electrically connected to the light-shielding layer through the signal via hole;

Forming a passivation layer on the interlayer insulating layer covering the source and the drain.

Herein, the step of conducting a conductive treatment on the active layer is a plasma treatment for reducing oxygen content of the metal oxide semiconductor material to reduce the resistivity of the metal oxide semiconductor material, and turning the metal oxide semiconductor material into a conductor.

The plasma comprises one or more of helium plasma, argon plasma, and ammonia plasma.

An area of the light-shielding layer is greater than that of the active layer, and an orthographic projection of the light-shielding layer on the base substrate covers the orthographic projection of the active layer on the base substrate; a thickness of the active layer is 100 Å-1000 Å, and the metal oxide semiconductor material includes one or more of indium-gallium-zinc-oxide, indium-zinc-tin-oxide, and indium-gallium-zinc-tin-oxide.

When the metal oxide semiconductor material is indium-gallium-zinc-oxide, and after conducting the conductive treatment on the source contact region and the drain contact region of the active layer, a molar ratio of indium, gallium, zinc and oxygen in the indium-gallium-zinc-oxide of the source contact region and the drain contact region of the active layer is, $In:Ga:Zn:O=1:1:1:X_2$, where $X_2$ is less than 1, and the molar ratio of indium, gallium, zinc and oxygen in the indium-gallium-zinc-oxide of the channel region of the active layer is, $In:Ga:Zn:O=1:1:1:X_1$, where $X_1$ is between 1 and 10.

The present disclosure further provide a top-gate self-aligned metal oxide semiconductor TFT, comprising an active layer, a light shielding layer disposed below the active layer, and a source connected to the light shielding layer.

The top-gate self-aligned metal oxide semiconductor TFT further comprises: a base substrate, a light-shielding layer disposed on the base substrate, a buffer layer disposed on the base substrate covering the light-shielding layer, an active layer disposed on the buffer layer corresponding to a region above the light-shielding layer, a gate insulating layer disposed on the active layer, a gate disposed on the gate insulting layer aligning with the gate insulting layer, an interlayer insulating layer disposed on the buffer layer covering the gate and the active layer, a source and a drain disposed on the interlayer insulating layer, and a passivation layer disposed on the interlayer insulating layer covering the source and the drain;

The active layer comprises a channel region corresponding to a region below the gate insulating layer, a source contact region and drain contact region respectively located at two sides of the channel region; a material of the source contact region and the drain contact region is a conductive metal oxide semiconductor material, a material of the channel region is a metal oxide semiconductor material having semiconductor properties;

A source contact hole and a drain contact hole are disposed on the interlayer insulating layer corresponding to the source contact region and the drain contact region, respectively, a signal via hole is disposed on the interlayer insulating layer and the buffer layer corresponding to a region above the light-shielding layer;

The source and the drain are respectively electrically connected to the source contact region and the drain contact region of the active layer through the source contact hole and the drain contact hole, while the source is electrically connected to the light-shielding layer through the signal via hole.

An area of the light-shielding layer is greater than that of the active layer, and an orthographic projection of the light-shielding layer on the base substrate covers the orthographic projection of the active layer on the base substrate; a thickness of the active layer is 100 Å-1000 Å, and the metal oxide semiconductor material includes one or more of indium-gallium-zinc-oxide, indium-zinc-tin-oxide, and indium-gallium-zinc-tin-oxide.

When the metal oxide semiconductor material is indium-gallium-zinc-oxide, a molar ratio of indium, gallium, zinc and oxygen in the indium-gallium-zinc-oxide of the source contact region and the drain contact region of the active layer is, $In:Ga:Zn:O=1:1:1:X_2$, where $X_2$ is less than 1, and the molar ratio of indium, gallium, zinc and oxygen in the indium-gallium-zinc-oxide of the channel region of the active layer is, $In:Ga:Zn:O=1:1:1:X_1$, where $X_1$ is between 1 and 10.

The present disclosure further provide a method of manufacturing a top-gate self-aligned metal oxide semiconductor TFT, comprising providing a light-shielding layer below an active layer, and connecting the light-shielding layer to a source. Herein, the method comprises:

Providing a base substrate, forming the light-shielding layer on the base substrate, forming a buffer layer on the base substrate covering the light-shielding layer, forming the active layer on the buffer layer corresponding to a region above the light-shielding layer, material of the active layer is a metal oxide semiconductor material;

Forming a gate insulating layer on the buffer layer covering the active layer, and depositing a gate metal layer on the gate insulating layer;

Forming a photoresist layer on the gate metal layer and patterning the photoresist layer by a photo lithography process, wherein the remaining photoresist layer defines a gate pattern on the gate metal layer;

Using the photoresist layer as a barrier and etching the gate metal layer to obtain a gate corresponding to a region above the active layer;

Using the photoresist layer and the gate as the barrier, etching the gate insulating layer by keeping only a portion corresponding to a region below the gate and removing other portions, wherein the keeping gate insulating layer is located on the active layer and aligned with the gate from top to bottom, the gate and the gate insulating layer define a channel region corresponding to a region below the gate insulating layer, as well as a source contact region and a drain contact region located on two sides of the channel region, respectively;

Using the photoresist layer, the gate and the gate insulating layer as the barrier, conducting a conductive treatment on the active layer, turning the metal oxide semiconductor material of the source contact region and the drain contact region into a conductor, keeping semiconductor characteristics for the metal oxide semiconductor material of the channel region; and peeling off the photoresist layer after the conductive treatment is completed;

Forming an interlayer insulating layer on the buffer layer covering the gate and the active layer; forming a source contact hole and a drain contact hole on the interlayer insulating layer corresponding respectively to the source contact region and the drain contact region, and simultaneously forming a signal via hole on the interlayer insulating layer and the buffer layer corresponding to a region above the light shielding layer;

Forming the source and a drain on the interlayer insulating layer, wherein the source and the drain are respectively electrically connected to the source contact region and the drain contact region through the source contact hole and the drain contact hole, while the source is electrically connected to the light-shielding layer through the signal via hole;

Forming a passivation layer on the interlayer insulating layer covering the source and the drain.

Herein the method of conducting a conductive treatment on the active layer is a plasma treatment for reducing oxygen content of the metal oxide semiconductor material, so as to reduce the resistivity of the metal oxide semiconductor material, and turn the metal oxide semiconductor material into a conductor.

Herein, the plasma comprises one or more of helium plasma, argon plasma, and ammonia plasma.

Herein, an area of the light-shielding layer is greater than that of the active layer, and an orthographic projection of the light-shielding layer on the base substrate covers the orthographic projection of the active layer on the base substrate; a thickness of the active layer is 100 Å-1000 Å, and the metal oxide semiconductor material includes one or more of indium-gallium-zinc-oxide, indium-zinc-tin-oxide, and indium-gallium-zinc-tin-oxide.

The beneficial effects of the present disclosure are: by providing a light-shielding layer below an active layer to protect the active layer from light irradiation and prevent the TFT from generating a negative threshold voltage drift phenomenon. Further, by connecting the light-shielding layer to the source, a stable voltage is generated on the light-shielding layer to avoid the floating gate effect, so as to improve the working stability of the TFT effectively. The top-gate self-aligned metal oxide semiconductor TFT produced by the above method described in the present disclosure does not generate negative threshold voltage drift phenomenon and floating gate effect, resulting in good working stability.

To further understand the present disclosure, features and technical contents of the present disclosure will now be described in detail with reference illustrated by accompanying drawings, which are illustration only, and not limitative of the present disclosure.

BRIEF DESCRIPTION OF THE DRAWINGS

The technical solutions and beneficial effects of the present disclosure will be dearly displayed in the following detailed description of specific embodiments with references to the accompanying drawings.

In the drawings.

DETAILED DESCRIPTION OF PREFERRED EMBODIMENTS

In order to understand the above objectives, features and advantages of the present disclosure more clearly, the present disclosure is described in detail below with references to the accompanying drawings and specific embodiments.

Figure 1:
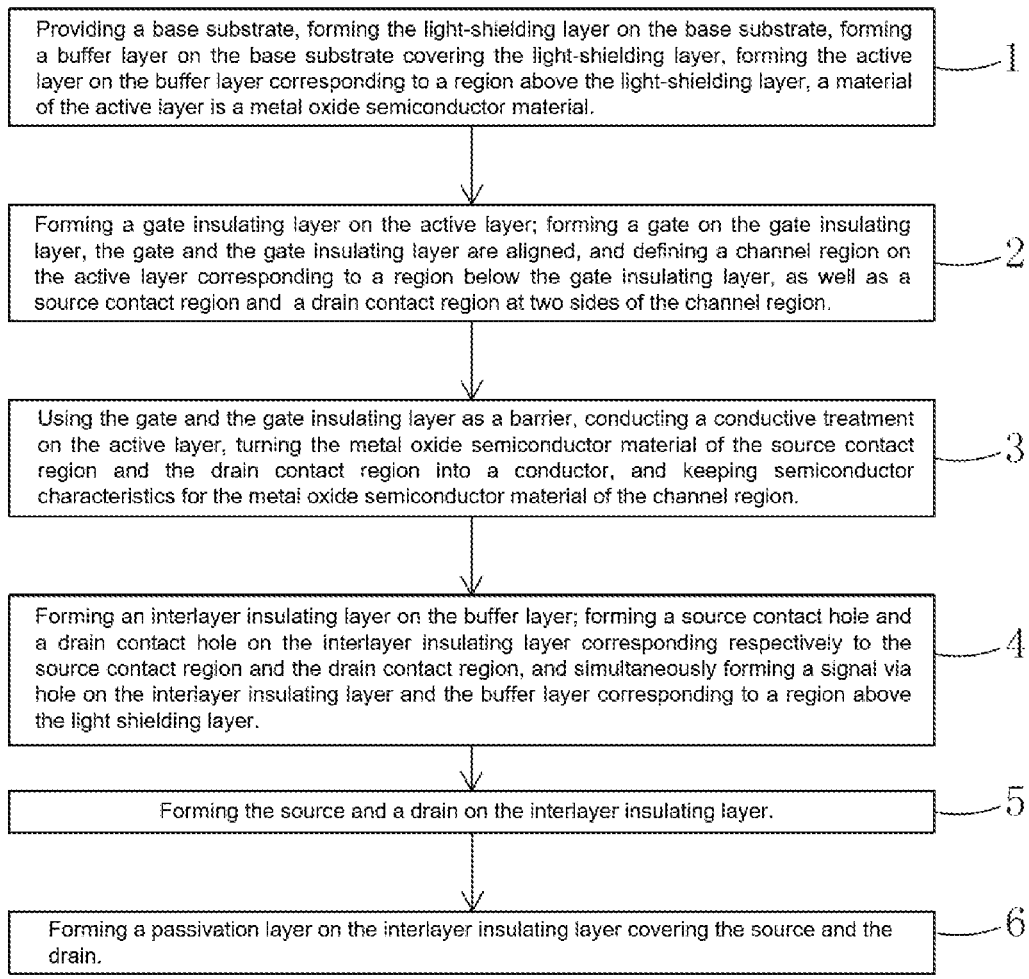
FIG. 1 is a flowchart of a method for manufacturing a top-gate self-aligned metal oxide semiconductor TFT in the present disclosure.
Figure 2:
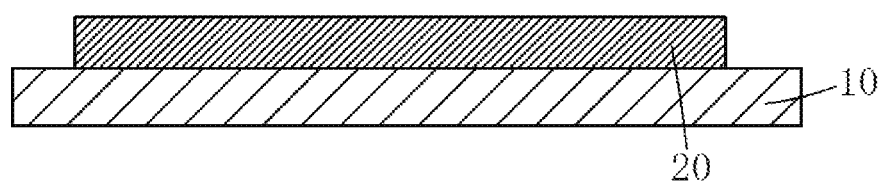
FIGS. 2-4 are schematic diagram of step 1 of a method for manufacturing a top-gate self-aligned metal oxide semiconductor TFT in the present disclosure.
Figure 3:
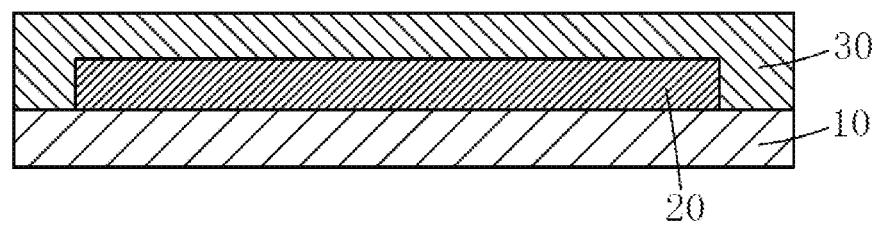
Figure 4:
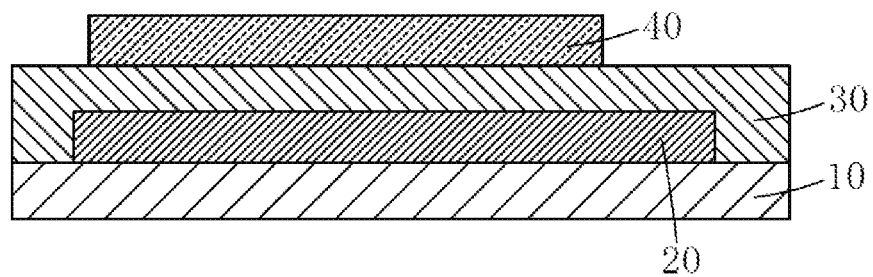

Referring to FIG. 1, the present disclosure provides a method of manufacturing a top-gate self-aligned metal oxide semiconductor TFT, comprising the following steps of:

Step 1, as shown in FIG. 2, providing a base substrate 10, forming the light-shielding layer 20 on the base substrate 10. As shown in FIG. 3, forming a buffer layer 30 on the base substrate 10 covering the light-shielding layer 20. As shown in FIG. 4, forming the active layer 40 on the buffer layer 30 corresponding to a region above the light-shielding layer 20. The material of the active layer 40 is a metal oxide semiconductor material.

Specifically, before forming the light-shielding layer 20, further comprises rising the base substrate 10.

Specifically, the light-shielding layer 20 is formed by patterning a metal layer deposited on the base substrate 10.

Specifically, the active layer 40 is formed by patterning a metal oxide semiconductor material deposited on the buffer layer 30.

Specifically, the area of the light-shielding layer 20 is greater than that of the active layer 40, and an orthographic projection of the light-shielding layer 20 on the base substrate 10 covers the orthographic projection of the active layer 40 on the base substrate 10. Therefore, the light-shielding layer 20 can fully cover the active layer 40, preventing the active layer 40 from TFT negative threshold voltage drift generated by light irradiation, so as to improve the TFT working stability.

Specifically, the base substrate 10 is a glass substrate.

Specifically, the thickness of the light-shielding layer 20 is 500 Å-2000 Å, the material of the light-shielding layer 20 is metal, and preferably, the light-shielding layer material is an alloy comprising one or more of molybdenum (Mo), aluminum (Al), copper (Cu), and titanium (Ti).

Specifically, the thickness of the buffer layer 30 is 1000 Å-5000 Å, the buffer layer 30 is a silicon oxide (SiOx) thin film, a silicon nitride (SiNx) thin film, or a composite thin film formed by alternately laminating a silicon oxide thin film and a silicon nitride thin film.

Specifically, the thickness of the active layer 40 is 100 Å-1000 Å, and the metal oxide semiconductor material includes one or more of indium-gallium-zinc-oxide (IGZO), indium-zinc-tin-oxide (IZTO), and indium-gallium-zinc-tin-oxide (IGZTO).

Figure 5:
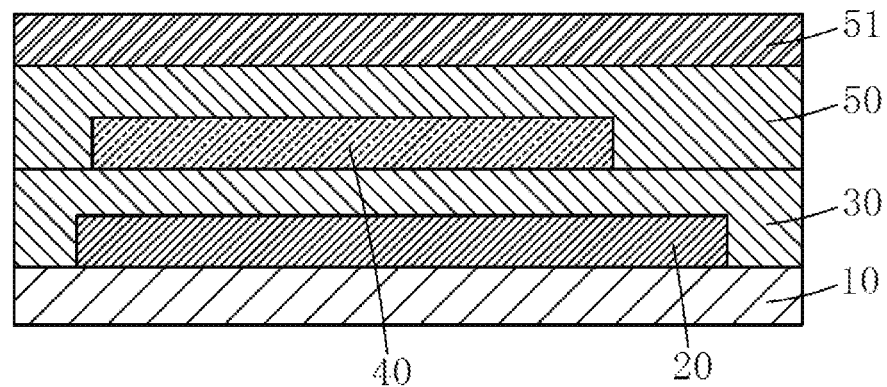
FIGS. 5-8 are schematic diagram of step 2 of a method for manufacturing a top-gate self-aligned metal oxide semiconductor TFT in the present disclosure.

Step 2, as shown in FIG. 5, forming a gate insulating layer 50 on the buffer layer 30 covering the active layer 40, and depositing a gate metal layer 51 on the gate insulating layer 50.

Figure 6:
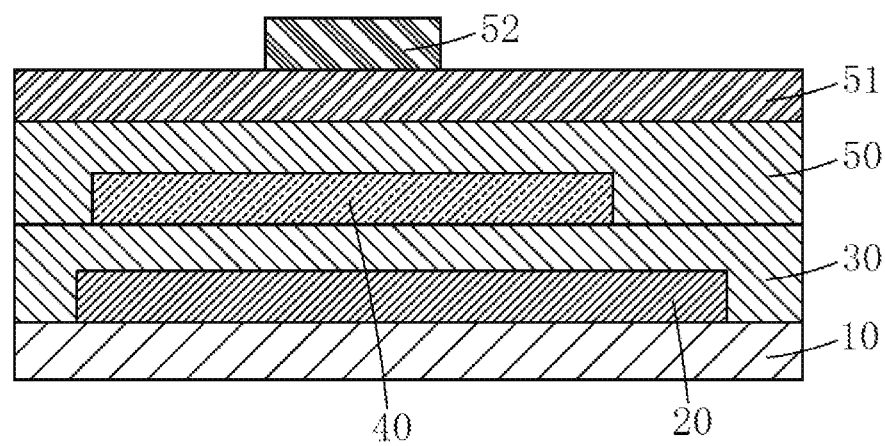

As shown in FIG. 6, forming a photoresist layer 52 on the gate metal layer 51 and patterning the photoresist layer 52 by a photo lithography process, wherein the remaining photoresist layer 52 defines a gate pattern on the gate metal layer 51.

Figure 7:
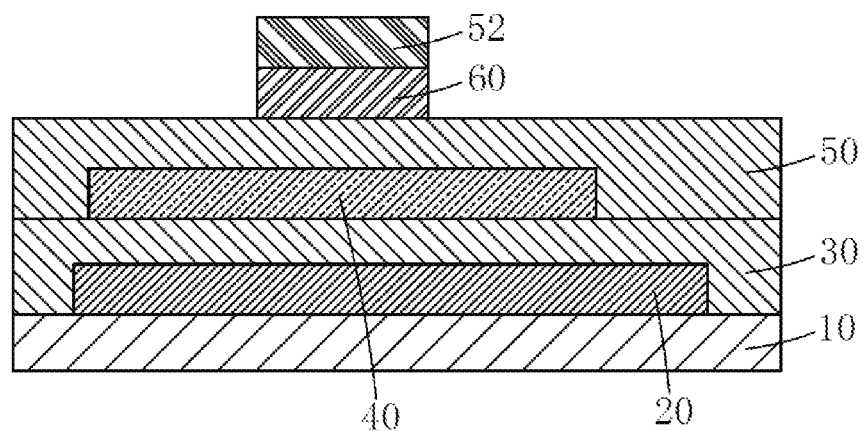

As shown in FIG. 7, using the photoresist layer 52 as a barrier and etching the gate metal layer 51 to obtain a gate 60 corresponding to a region above the active layer 40.

Figure 8:
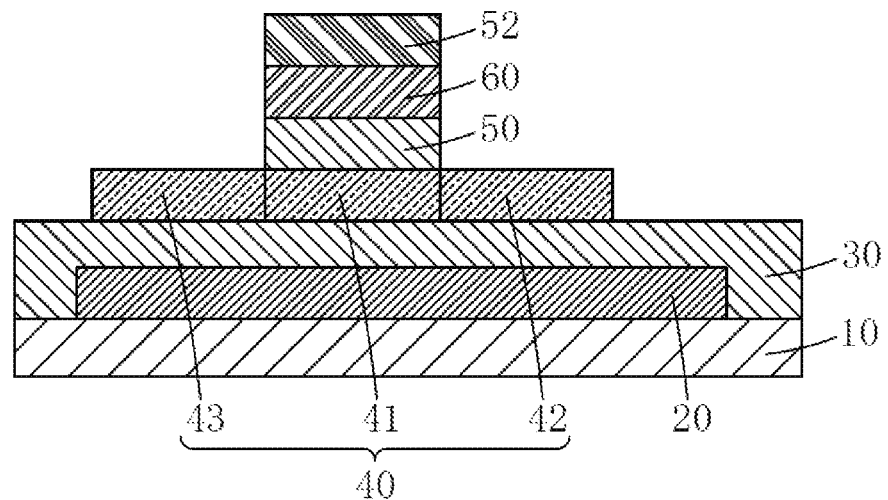

As shown in FIG. 8, using the photoresist layer 52 and the gate 60 as the barrier, etching the gate insulating layer 50 by keeping only a portion corresponding to a region below the gate 60 and removing other portions. Herein, the keeping gate insulating layer 50 is located on the active layer 40 and aligned with the gate 60 from top to bottom, the gate 60 and the gate insulating layer 50 define a channel region 41 corresponding to a region below the gate insulating layer 50, as well as a source contact region 42 and a drain contact region 43 located on two sides of the channel region 41, respectively.

Specifically, the thickness of the gate insulating layer is 1000 Å-3000 Å, the gate insulating layer 50 is a silicon oxide (SiOx) thin film, a silicon nitride (SiNx) thin film, or a composite thin film formed by alternately laminating a silicon oxide thin film and a silicon nitride thin film.

Specifically, the thickness of the gate 60 is 2000 Å-8000 Å, the material of the gate 60 is an alloy comprising one or more of molybdenum (Mo), aluminum (Al), copper (Cu), and titanium (Ti).

Figure 9:
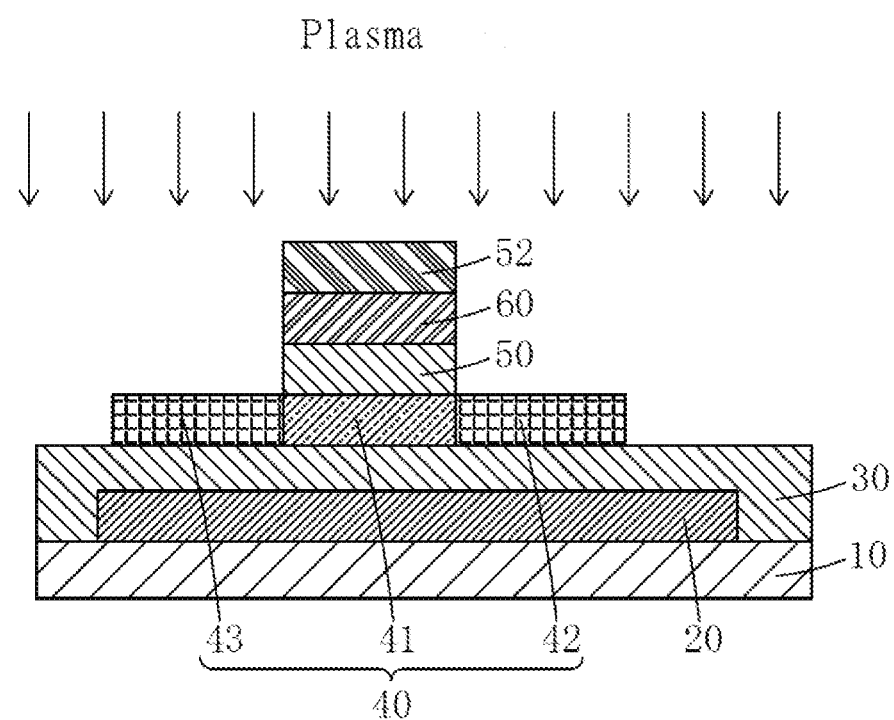
FIGS. 9-10 are schematic diagram of step 3 of a method for manufacturing a top-gate self-aligned metal oxide semiconductor TFT in the present disclosure.
Figure 10:
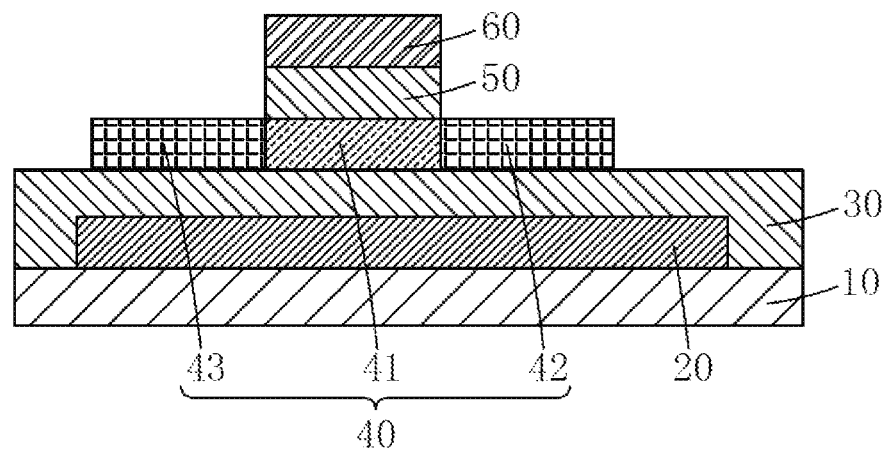

Step 3, as shown in FIG. 9, using the photoresist layer 52, the gate 60 and the gate insulating layer 50 as the barrier, conducting a conductive treatment on the active layer 40, turning the metal oxide semiconductor material of the source contact region 42 and the drain contact region 43 into a conductor, keeping semiconductor characteristics for the metal oxide semiconductor material of the channel region 41; and as shown in FIG. 10, further peeling off the photoresist layer 52 after the conductive treatment is completed.

Specifically, the step of conducting a conductive treatment on the active layer 40 is a plasma treatment for reducing oxygen content of the metal oxide semiconductor material, so as to reduce the resistivity of the metal oxide semiconductor material, and turn the metal oxide semiconductor material into a conductor. In particular, the plasma comprises one or more of helium plasma, argon plasma, and ammonia plasma.

Specifically, when the metal oxide semiconductor material is indium-gallium-zinc-oxide (IGZO), before carrying the plasma treatment, the molar ratio of indium, gallium, zinc and oxygen in the indium-gallium-zinc-oxide is, In:Ga:Zn:O=1:1:1:$X_1$, where $X_1$ is between 1 and 10. After conducting the conductive treatment, the molar ratio of indium, gallium, zinc and oxygen in the indium-gallium-zinc-oxide is, In:Ga:Zn:O=1:1:1:$X_2$, where $X_2$ is less than 1. Therefore, after conducting the conductive treatment on active layer 40, the molar ratio of indium, gallium, zinc and oxygen in the indium-gallium-zinc-oxide of the source contact region 42 and the drain contact region 43 of the active layer 40 is, In:Ga:Zn:O=1:1:1:$X_2$, where $X_2$ is less than 1, and the molar ratio of indium, gallium, zinc and oxygen in the indium-gallium-zinc-oxide of the channel region 41 of the active layer 40 is, In:Ga:Zn:O=1:1:1:$X_1$, where $X_1$ is between 1 and 10.

The top-gate self-aligning structure adopted In the present disclosure defines a channel region 41 corresponding to a region below the gate insulating layer 50, as well as a source contact region 42 and a drain contact region 43 located on both sides of the channel region 41. The gate 60 and the gate insulating layer can protect the channel region 41 of the active layer 40 from being conductive during the conducting process of the active layer 40.

Figure 11:
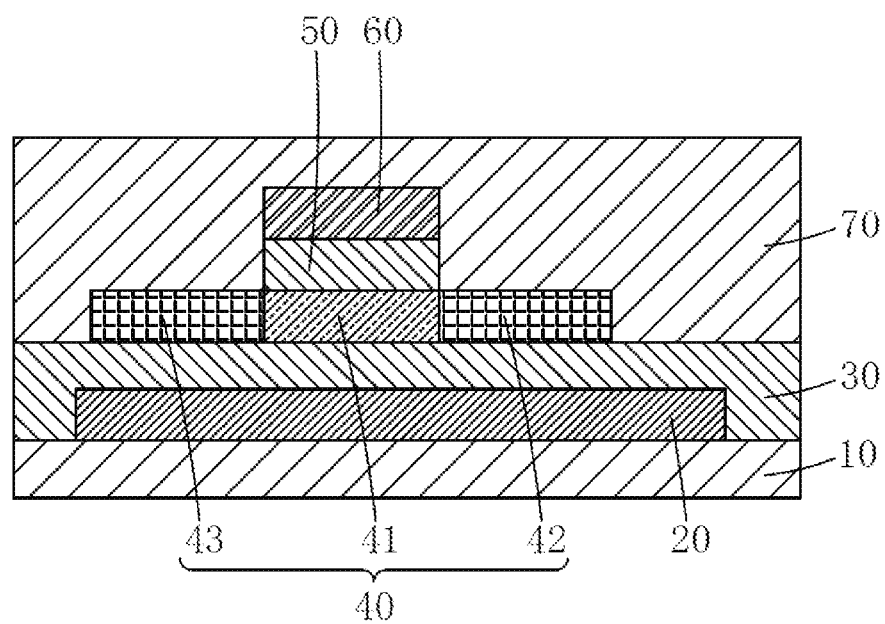
FIGS. 11-12 are schematic diagram of step 4 of a method for manufacturing a top-gate self-aligned metal oxide semiconductor TFT in the present disclosure.
Figure 12:
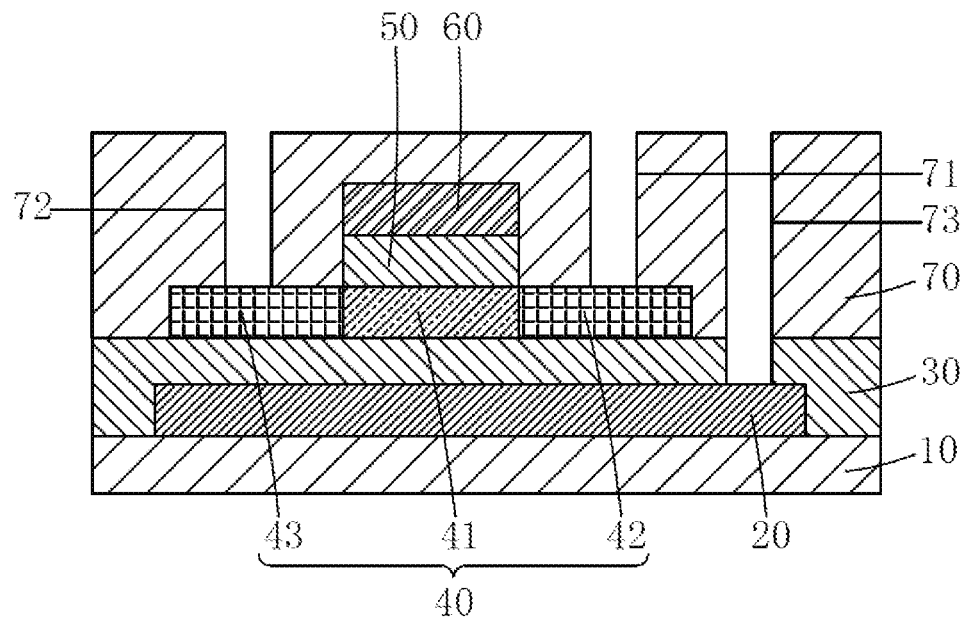

Step 4, as shown in FIG. 11, forming an interlayer insulating layer 70 on the buffer layer 30 covering the gate 60 and the active layer 40. As shown in FIG. 12, forming a source contact hole 71 and a drain contact hole 72 on the interlayer insulating layer 70 respectively corresponding to the region above the source contact region 42 and the drain contact region 43, and simultaneously forming a signal via hole 73 on the interlayer insulating layer 70 and the buffer layer 30 corresponding to a region above the light shielding layer 20.

Specifically, the thickness of the interlayer insulating layer 70 is 2000 Å-10000 Å, the interlayer insulating layer 70 is a silicon oxide (SiOx) thin film, a silicon nitride (SiNx) thin film, or a composite thin film formed by alternately laminating a silicon oxide thin film and a silicon nitride thin film.

Specifically, the source contact hole 71, the drain contact hole 72, and the signal via hole 73 are formed in the same photo lithography process.

Figure 13:
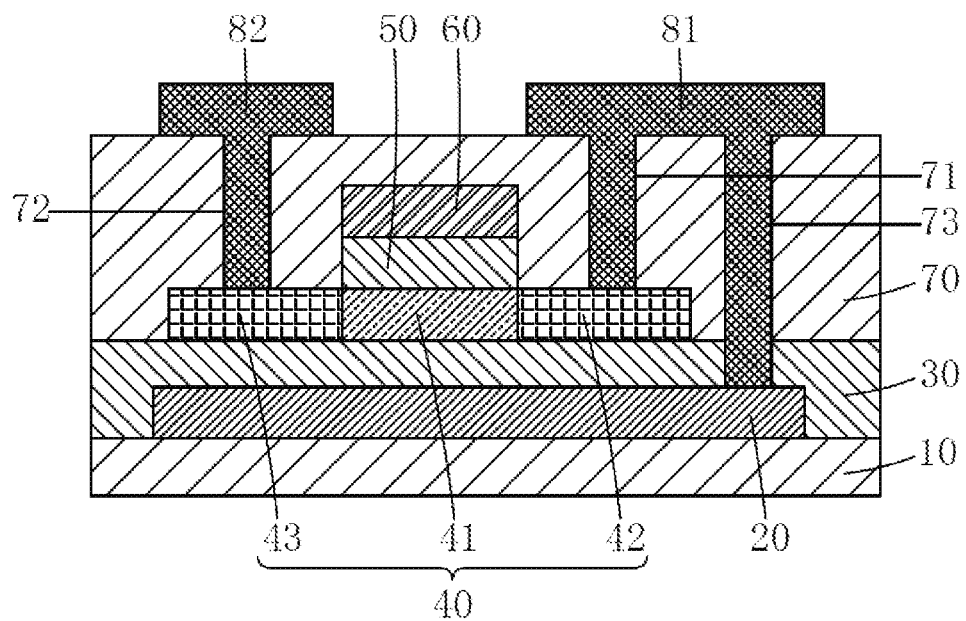
FIG. 13 is schematic diagram of step 5 of a method for manufacturing a top-gate self-aligned metal oxide semiconductor TFT in the present disclosure.

Step 5, as shown in FIG. 13, forming the source 81 and a drain 82 on the interlayer insulating layer 70. Herein, the source 81 and the drain 82 are respectively electrically connected to the source contact region 42 and the drain contact region 43 through the source contact hole 71 and the drain contact hole 72, while the source 81 is electrically connected to the light-shielding layer 20 through the signal via hole 73.

Specifically, the thickness of the source 81 and the drain 82 is 2000 Å-8000 Å, the material of the source 81 and the drain 82 is an alloy comprising one or more of molybdenum (Mo), aluminum (Al), copper (Cu), and titanium (Ti).

Specifically, the source 81 and the drain 82 are formed by patterning a deposited metal layer.

In the present disclosure, a stable voltage is generated on the light-shielding layer 20 by connecting the light-shielding layer 20 to the source 81, so as to avoid the floating gate effect and ensure the working stability of the TFT.

Figure 14:
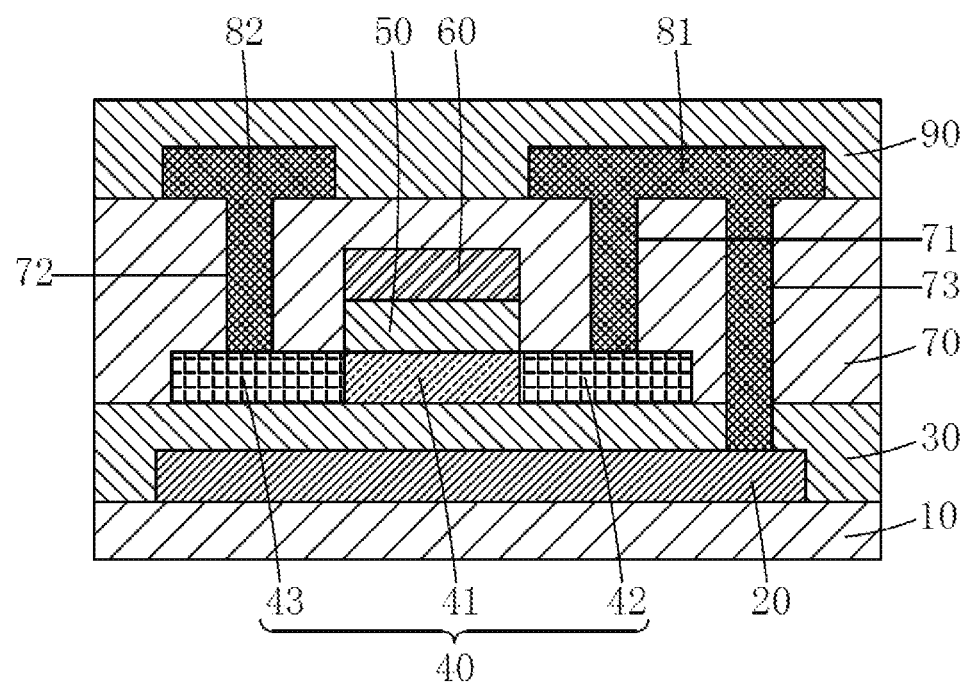
FIG. 14 is schematic diagram of step 6 of a method for manufacturing a top-gate self-aligned metal oxide semiconductor TFT in the present disclosure.

Step 6, as shown in FIG. 14, forming a passivation layer 90 on the interlayer insulating layer 70 covering the source 81 and the drain 82. The production of a top gate self-aligned metal oxide semiconductor TFT is now completed.

Specifically, the thickness of the passivation layer 90 is 1000 Å-5000 Å, the passivation layer 90 is a silicon oxide (SiOx) thin film, a silicon nitride (SiNx) thin film, or a composite thin film formed by alternately laminating a silicon oxide thin film and a silicon nitride thin film.

The method of manufacturing a top-gate self-aligned metal oxide semiconductor TFT of the present disclosure is that by providing a light-shielding layer 20 below an active layer 40 to protect the active layer 40 from light irradiation and prevent the TFT from generating a negative threshold voltage drift phenomenon. Further, by connecting the light-shielding layer 20 to the source 80, a stable voltage is generated on the light-shielding layer to avoid the floating gate effect, so as to improve the working stability of the TFT effectively.

Referring to FIG. 14, based on the above method of manufacturing a top-gate metal oxide semiconductor TFT, the present disclosure further comprises a top-gate metal oxide semiconductor TFT, including: a base substrate 10, a light-shielding layer 20 disposed on the base substrate 10, a buffer layer 30 disposed on the base substrate 10 covering the light-shielding layer 20, an active layer 40 disposed on the buffer layer 30 corresponding to a region above the light-shielding layer 20, a gate insulating layer 50 disposed on the active layer 40, a gate 60 disposed on the gate insulting layer 50 aligning with the gate insulting layer 50, an interlayer insulating layer 70 disposed on the buffer layer 30 covering the gate 60 and the active layer 40, a source 81 and a drain 82 disposed on the interlayer insulating layer 70, and a passivation layer 90 disposed on the interlayer insulating layer 70 covering the source 81 and the drain 82.

The active layer 40 comprises a channel region 41 corresponding to a region below the gate insulating layer 50, a source contact region 42 and drain contact region 43 respectively located at two sides of the channel region 41. The material of the source contact region 42 and the drain contact region 43 is a conductive metal oxide semiconductor material, the material of the channel region 41 is a metal oxide semiconductor material having semiconductor properties.

A source contact hole 71 and a drain contact hole 72 are disposed on the interlayer insulating layer 70 corresponding to the source contact region 42 and the drain contact region 43, respectively. A signal via hole 73 is disposed on the interlayer insulating layer 70 and the buffer layer 30 corresponding to a region above the light-shielding layer 20.

The source 81 and the drain 82 are respectively electrically connected to the source contact region 42 and the drain contact region 43 of the active layer 40 through the source contact hole 71 and the drain contact hole 72, while the source 81 is electrically connected to the light-shielding layer 20 through the signal via hole 73.

Specifically, the base substrate 10 is a glass substrate.

Specifically, the thickness of the light-shielding layer 20 is 500 Å-2000 Å, the material of the light-shielding layer 20 is metal, and preferably, the light-shielding layer material is an alloy comprising one or more of molybdenum (Mo), aluminum (Al), copper (Cu), and titanium (Ti).

Specifically, the thickness of the buffer layer 30 is 1000 Å-5000 Å, the buffer layer 30 is a silicon oxide (SiOx) thin film, a silicon nitride (SiNx) thin film, or a composite thin film formed by alternately laminating a silicon oxide thin film and a silicon nitride thin film.

Specifically, the thickness of the active layer 40 is 100 Å-1000 Å, and the metal oxide semiconductor material includes one or more of indium-gallium-zinc-oxide (IGZO), indium-zinc-tin-oxide (IZTO), and indium-gallium-zinc-tin-oxide (IGZTO).

Specifically, when the metal oxide semiconductor material is indium-gallium-zinc-oxide (IGZO), the molar ratio of indium, gallium, zinc and oxygen in the indium-gallium-zinc-oxide of the source contact region 42 and the drain contact region 43 of the active layer 40 is, $In:Ga:Zn:O=1:1:1:X_2$, where $X_2$ is less than 1; and the molar ratio of indium, gallium, zinc and oxygen in the indium-gallium-zinc-oxide of the channel region 41 of the active layer 40 is, $In:Ga:Zn:O=1:1:1:X_1$, where $X_1$ is between 1 and 10.

Specifically, the thickness of the gate insulating layer 50 is 1000 Å-3000 Å, the gate insulating layer 50 is a silicon oxide (SiOx) thin film, a silicon nitride (SiNx) thin film, or a composite thin film formed by alternately laminating a silicon oxide thin film and a silicon nitride thin film.

Specifically, the thickness of the gate 60 is 2000 Å-8000 Å, the material of the gate 60 is an alloy comprising one or more of molybdenum (Mo), aluminum (Al), copper (Cu), and titanium (Ti).

Specifically, the thickness of the interlayer insulating layer 70 is 2000 Å-10000 Å, the interlayer insulating layer 70 is a silicon oxide (SiOx) thin film, a silicon nitride (SiNx) thin film, or a composite thin film formed by alternately laminating a silicon oxide thin film and a silicon nitride thin film.

Specifically, the thickness of the source 81 and the drain 82 is 2000 Å-8000 Å, the material of the source 81 and the drain 82 is an alloy comprising one or more of molybdenum (Mo), aluminum (Al), copper (Cu), and titanium (Ti).

Specifically, the thickness of the passivation layer 90 is 1000 Å-5000 Å, the passivation layer 90 is a silicon oxide (SiOx) thin film, a silicon nitride (SiNx) thin film, or a composite thin film formed by alternately laminating a silicon oxide thin film and a silicon nitride thin film.

The top gate self-aligned metal oxide semiconductor TFT of the present disclosure is that by providing a light-shielding layer 20 below an active layer 40 to protect the active layer 40 from light irradiation and prevent the TFT from generating a negative threshold voltage drift phenomenon. Further, by connecting the light-shielding layer 20 to the source 81, a stable voltage is generated on the light-shielding layer 20 to avoid the floating gate effect, so as to improve the working stability of the TFT effectively.

In summary, the present disclosure provides a top-gate self-aligned metal oxide semiconductor TFT and a manufacturing method thereof. The method of manufacturing a top-gate self-aligned metal oxide semiconductor TFT in the present disclosure is: by providing a light-shielding layer below the active layer to prevent the TFT from generating a negative voltage threshold phenomenon. Further, by connecting the light-shielding layer 20 to the source, a stable voltage is generated on the light-shielding layer to avoid the floating gate effect, so as to improve the working stability of the TFT effectively. The top-gate self-aligned metal oxide semiconductor TFT produced by the method of the present disclosure does not generate negative threshold voltage drift phenomenon and floating gate effect, resulting in good working stability.

While the disclosure has been particularly shown and described with reference to exemplary embodiments thereof, it will be understood by those skilled in the art that various changes in form and details may be made therein without departing from the spirit and scope of the disclosure as defined by the appended claims and their equivalents.

What is claimed is:

1. A method of manufacturing a top-gate self-aligned metal oxide semiconductor TFT, wherein a light-shielding layer is provided below an active layer and the light-shielding layer is connected to a source, and the method comprises:

providing a base substrate, forming the light-shielding layer on the base substrate, forming a buffer layer on the base substrate covering the light-shielding layer, forming the active layer on the buffer layer corresponding to a region above the light-shielding layer, a material of the active layer is a metal oxide semiconductor material;

forming a gate insulating layer on the buffer layer covering the active layer, and depositing a gate metal layer on the gate insulating layer;

forming a photoresist layer on the gate metal layer and patterning the photoresist layer by a photo lithography process, wherein the remaining photoresist layer defines a gate pattern on the gate metal layer;

using the photoresist layer as a barrier and etching the gate metal layer to obtain a gate corresponding to a region above the active layer;

using the photoresist layer and the gate as the barrier, etching the gate insulating layer by keeping only a portion corresponding to a region below the gate and removing other portions, wherein the keeping gate insulating layer is located on the active layer and aligned with the gate from top to bottom, the gate and the gate insulating layer define a channel region corresponding to a region below the gate insulating layer, as well as a source contact region and a drain contact region located on two sides of the channel region, respectively;

using the photoresist layer, the gate and the gate insulating layer as the barrier, conducting a conductive treatment on the active layer, turning the metal oxide semiconductor material of the source contact region and the drain contact region into a conductor, keeping semiconductor characteristics for the metal oxide semiconductor material of the channel region; and peeling off the photoresist layer after the conductive treatment is completed;

forming an interlayer insulating layer on the buffer layer covering the gate and the active layer; forming a source contact hole and a drain contact hole on the interlayer insulating layer corresponding respectively to the source contact region and the drain contact region, and simultaneously forming a signal via hole on the interlayer insulating layer and the buffer layer corresponding to a region above the light shielding layer;

forming the source and a drain on the interlayer insulating layer, wherein the source and the drain are respectively electrically connected to the source contact region and the drain contact region through the source contact hole and the drain contact hole, while the source is electrically connected to the light-shielding layer through the signal via hole; and forming a passivation layer on the interlayer insulating layer covering the source and the drain.

2. The method of manufacturing a top-gate self-aligned metal oxide semiconductor TFT according to claim 1, wherein the method of conducting a conductive treatment on the active layer is a plasma treatment for reducing oxygen content of the metal oxide semiconductor material, so as to reduce the resistivity of the metal oxide semiconductor material, and turn the metal oxide semiconductor material into a conductor.

3. The method of manufacturing a top-gate self-aligned metal oxide semiconductor TFT according to claim 2, wherein the plasma comprises one or more of helium plasma, argon plasma, and ammonia plasma.

4. The method of manufacturing a top-gate self-aligned metal oxide semiconductor TFT according to claim 1, wherein an area of the light-shielding layer is greater than that of the active layer, and an orthographic projection of the light-shielding layer on the base substrate covers the orthographic projection of the active layer on the base substrate; a thickness of the active layer is 100 Å-1000 Å, and the metal oxide semiconductor material includes one or more of indium-gallium-zinc-oxide, indium-zinc-tin-oxide, and indium-gallium-zinc-tin-oxide.

5. The method of manufacturing a top-gate self-aligned metal oxide semiconductor TFT according to claim 4, wherein when the metal oxide semiconductor material is indium-gallium-zinc-oxide, and after conducting the conductive treatment on the source contact region and the drain contact region of the active layer, a molar ratio of indium, gallium, zinc and oxygen in the indium-gallium-zinc-oxide of the source contact region and the drain contact region of the active layer is, $In:Ga:Zn:O=1:1:1:X_2$, where $X_2$ is less than 1, and the molar ratio of indium, gallium, zinc and oxygen in the indium-gallium-zinc-oxide of the channel region of the active layer is, $In:Ga:Zn:O=1:1:1:X_1$, where $X_1$ is between 1 and 10.

6. A method of manufacturing a top-gate self-aligned metal oxide semiconductor TFT, comprising providing a light-shielding layer below an active layer, and connecting the light-shielding layer to a source; the method further comprising:

providing a base substrate, forming the light-shielding layer on the base substrate, forming a buffer layer on the base substrate covering the light-shielding layer, forming the active layer on the buffer layer corresponding to a region above the light-shielding layer, a material of the active layer is a metal oxide semiconductor material;

forming a gate insulating layer on the buffer layer covering the active layer, and depositing a gate metal layer on the gate insulating layer;

forming a photoresist layer on the gate metal layer and patterning the photoresist layer by a photo lithography process, wherein the remaining photoresist layer defines a gate pattern on the gate metal layer;

using the photoresist layer as a barrier and etching the gate metal layer to obtain a gate corresponding to a region above the active layer;

using the photoresist layer and the gate as the barrier, etching the gate insulating layer by keeping only a portion corresponding to a region below the gate and removing other portions, wherein the keeping gate insulating layer is located on the active layer and aligned with the gate from top to bottom, the gate and the gate insulating layer define a channel region corresponding to a region below the gate insulating layer, as well as a source contact region and a drain contact region located on two sides of the channel region, respectively;

using the photoresist layer, the gate and the gate insulating layer as the barrier, conducting a conductive treatment on the active layer, turning the metal oxide semiconductor material of the source contact region and the drain contact region into a conductor, keeping semiconductor characteristics for the metal oxide semiconductor material of the channel region; and peeling off the photoresist layer after the conductive treatment is completed;

forming an interlayer insulating layer on the buffer layer covering the gate and the active layer; forming a source contact hole and a drain contact hole on the interlayer insulating layer corresponding respectively to the source contact region and the drain contact region, and simultaneously forming a signal via hole on the interlayer insulating layer and the buffer layer corresponding to a region above the light shielding layer;

forming the source and a drain on the interlayer insulating layer, wherein the source and the drain are respectively electrically connected to the source contact region and the drain contact region through the source contact hole and the drain contact hole, while the source is electrically connected to the light-shielding layer through the signal via hole;

forming a passivation layer on the interlayer insulating layer covering the source and the drain;

wherein the method of conducting a conductive treatment on the active layer is a plasma treatment for reducing oxygen content of the metal oxide semiconductor material, so as to reduce the resistivity of the metal oxide semiconductor material, and turn the metal oxide semiconductor material into a conductor;

wherein the plasma comprises one or more of helium plasma, argon plasma, and ammonia plasma; and wherein an area of the light-shielding layer is greater than that of the active layer, and an orthographic projection of the light-shielding layer on the base substrate covers the orthographic projection of the active layer on the base substrate; a thickness of the active layer is 100 Å-1000 Å, and the metal oxide semiconductor material includes one or more of indium-gallium-zinc-oxide, indium-zinc-tin-oxide, and indium-gallium-zinc-tin-oxide.

7. The method of manufacturing a top-gate self-aligned metal oxide semiconductor TFT according to claim 6, wherein when the metal oxide semiconductor material is indium-gallium-zinc-oxide, and after conducting the conductive treatment on the source contact region and the drain contact region of the active layer, a molar ratio of indium, gallium, zinc and oxygen in the indium-gallium-zinc-oxide of the source contact region and the drain contact region of the active layer is, $In:Ga:Zn:O=1:1:1:X_2$, where $X_2$ is less than 1, and the molar ratio of indium, gallium, zinc and oxygen in the indium-gallium-zinc-oxide of the channel region of the active layer is, $In:Ga:Zn:O=1:1:1:X_1$, where $X_1$ is between 1 and 10.

* * * * *